(12) United States Patent
Petrovic

(10) Patent No.: US 7,495,484 B1
(45) Date of Patent: Feb. 24, 2009

(54) PROGRAMMABLE FREQUENCY MULTIPLIER

(75) Inventor: Branislav A. Petrovic, La Jolla, CA (US)

(73) Assignee: General Instrument Corporation, Horsham, PA (US)

( * ) Notice: Subject to any disclaimer, the term of this patent is extended or adjusted under 35 U.S.C. 154(b) by 21 days.

(21) Appl. No.: 11/830,445

(22) Filed: Jul. 30, 2007

(51) Int. Cl.
   *H03B 19/06* (2006.01)
(52) U.S. Cl. .................. 327/119; 327/122; 327/333
(58) Field of Classification Search ............... 327/119, 327/122, 333
   See application file for complete search history.

(56) References Cited

U.S. PATENT DOCUMENTS

| | | | | |
|---|---|---|---|---|
| 4,755,761 A | * | 7/1988 | Ray, Jr. ..................... 329/323 |
| 5,412,351 A | * | 5/1995 | Nystrom et al. ............. 332/103 |
| 5,789,953 A | * | 8/1998 | Au et al. ..................... 327/116 |
| 6,005,420 A | * | 12/1999 | Yoshizawa et al. .......... 327/116 |
| 6,118,313 A | * | 9/2000 | Yakabe et al. ............... 327/116 |
| 6,240,142 B1 | * | 5/2001 | Kaufman et al. ............ 375/261 |
| 6,246,271 B1 | * | 6/2001 | Takada et al. ............... 327/116 |
| 6,456,143 B2 | * | 9/2002 | Masumoto et al. .......... 327/356 |
| 6,847,255 B2 | * | 1/2005 | Petrovic et al. ............. 329/323 |
| 6,982,592 B2 | * | 1/2006 | Petrovic et al. ............. 329/323 |
| 6,995,595 B2 | * | 2/2006 | Kim ........................... 327/254 |
| 7,006,814 B2 | * | 2/2006 | Ichihara ...................... 455/324 |
| 7,119,588 B2 | * | 10/2006 | Kelley ........................ 327/116 |
| 7,386,286 B2 | * | 6/2008 | Petrovic et al. ............. 455/165.1 |
| 2003/0016762 A1 | * | 1/2003 | Martin et al. ............... 375/308 |
| 2004/0207464 A1 | * | 10/2004 | Petrovic et al. ............. 329/315 |
| 2005/0096000 A1 | * | 5/2005 | Petrovic et al. ............. 455/255 |
| 2006/0057996 A1 | * | 3/2006 | Petrovic et al. ............. 455/260 |

* cited by examiner

*Primary Examiner*—Kenneth B Wells
*Assistant Examiner*—Adam Houston
(74) *Attorney, Agent, or Firm*—Larry T. Cullen

(57) ABSTRACT

A programmable frequency multiplier device which includes a frequency doubler section configured to receive an input signal having a frequency f, and to output doubled signals, each of the doubled signals having a frequency $2^n \times f$ (n=0, 1, 2, ...); a selector section configured to select a plurality of the doubled signals output from the frequency doubler section, and to output the plurality of the selected doubled signals as selected signals; and a frequency summation section configured to multiply the selected signals, and to output a multiplied signal having a frequency $f_{out} = f \times (m_0 2^0 + m_1 2^1 + \ldots + m_k 2^k + \ldots + m_n 2^n)$, wherein $m_k = 0$ or 1, and k=0, 1, ..., n.

20 Claims, 4 Drawing Sheets

PROGRAMMABLE FREQUENCY MULTIPLIER

RELATED APPLICATIONS

U.S. patent application Ser. No. 11/737,384 filed on Apr. 19, 2007, which is entitled "BROADBAND LOW NOISE COMPLEX FREQUENCY MULTIPLIERS", is herein incorporated by reference.

BACKGROUND OF THE INVENTION

1. Field of the Invention

This invention relates to a device and method for performing frequency multiplication which exhibits low phase noise. More particularly, the present invention provides for programmable frequency multiplication by using an array of Complex Frequency Shifters (CFS's) in combination with signal routing controlled by the an array of programmable switches.

2. Background of the Related Art

Frequency multipliers along with frequency dividers are among the very essential building blocks in frequency generation and synthesis devices and are extensively used in these and many other applications. Signal sources with very low phase noise are increasingly more in demand as the frequencies utilized by such devices continue to increase along with the overall performance requirements. For example, the jitter of the clock caused by phase noise limits the achievable signal-to-noise ratio "SNR" in high speed ADCs/DACs. Reducing the clock jitter improves the achievable performance and allows higher frequency operation in demanding applications. This is one example among many where a low noise frequency multiplier allows for improved operating performance.

Numerous types of frequency multipliers are known in the art (e.g., frequency doublers), and include both analog and digital based devices. Generally speaking, analog multipliers have some advantages over digital multipliers in that they can operate at higher frequencies, achieve higher multiplication ratios, have lower phase noise and lower broadband noise, and consume less power. Analog multipliers can typically be divided in two categories: direct analog multipliers and the multipliers based on multiplying phase-lock loops or other schemes employing closed loop feedback systems or injection-locking mechanisms. As explained in detail below, the present invention falls within the category of direct analog multipliers.

Direct analog multipliers can further be divided into multipliers based on parametric nonlinearities of components, for instance nonlinear conductance or capacitive reactance and those using multiplying devices, such as mixers. Discrete circuits using nonlinearities of components such as diodes or transistors have been extensively used in the prior art, but typically need to be tuned to a specific frequency range or spectral component and are narrow-band. Mixer-based multipliers are a more systematic way of performing frequency multiplication, and provide wider bandwidth capabilities and have potential for larger multiplication ratios.

A typical mixer-based frequency doubler circuit of the prior art is shown in the block diagram of FIG. 1. Referring to FIG. 1, the device includes a mixer 10 which serves as a multiplier of the input signal $\cos(\omega t)$ present at input 14 with itself and thereby up-converts the frequency to a double frequency $\cos(2\omega t)$ at the output 12. The amplitude of the up-converted signal is ½ of the input amplitude representing a 6 dB loss. The multiplication in mixer 10 is a double sideband conversion (DSB), meaning the multiplication also generates another sideband, a DC component in this case (term ½ at the output 12). This term is not desired because it burdens the dynamic range of the mixer 10 resulting in reduced converted signal level and consequently reduced signal to noise ratio (SNR). When compared with a single sideband conversion (SSB), the DSB conversion will exhibit a 3 dB lower SNR because only one of the two converted sidebands is used while the other one is wasted, i.e. half of the converted power is lost, resulting in a 3 dB SNR reduction. This loss of SNR adds to other circuit implementation losses and of course can not be recovered by any amount of post-mixer gain.

Another prior art multiplier circuit is illustrated in the block diagram of FIG. 2. As shown in FIG. 2, the device includes a cascade of doublers each of which contains a mixer 10. As a result, the device achieves a frequency multiplication by a factor of $2^n$, where n represents the number of frequency doublers (i.e., mixers). In each stage, mixer 10 is driven with signals in phase quadrature, as one of the signals coupled to the mixer is output by a quadrature splitting circuit 30. Multiplying the quadrature signals results in a product with no DC content at the output thereby improving the dynamic range. One drawback of the cascade device of FIG. 2 is that the quadrature splitting circuit 30 needs to be repeated in every stage, adding to the complexity and reducing the bandwidth (BW) of the system. The BW is reduced because the quadrature splitting circuits 30 are effectively connected in series with each other, resulting in a reduction of the aggregate BW compared with a BW of a single quadrature splitter. Since the frequency is different (i.e., doubled) at every stage, the quadrature splitter 30 at each stage is different from the other stages, and needs to be designed and tuned to a different frequency thus complicating the design and manufacturing of the device. Another drawback of this circuit is the loss of SNR due to DSB conversion, which increases the SNR degradation from stage to stage by 3 dB, as compared with SSB conversion.

While devices for performing frequency multiplication by factorial of two (2) (for instance 2, 4, 8 . . . ) have been addressed in the prior art, that is not the case for frequency multiplication by an arbitrary integer factors. Generally speaking, devices for performing frequency multiplication by an arbitrary integer factor have not been addressed in the prior art. In particular, the prior art fails to provide the frequency multiplication by an arbitrary, integer factor which is programmable. Thus, there remains a need for a programmable frequency multiplication device which provides for multiplication by arbitrary integer factors, which exhibits improved SNR and addresses the other limitations noted above.

SUMMARY OF THE INVENTION

It is one objective of the present invention to provide a programmable frequency multiplier capable of multiplication by arbitrary integer factors and corresponding method which exhibits very low phase noise, and which is suitable for use to provide dynamically programmable sources in multi-band and other systems achieving far lower phase noise than with traditional synthesizers.

It is another objective of the present invention to provide a programmable frequency multiplier method and corresponding apparatus which achieves very wide frequency range of operation from low frequencies near DC to very high frequencies close to the transition frequency $f_T$ of the active devices utilized.

It is yet another objective of the present invention to provide a programmable frequency multiplier method and corresponding apparatus which simplifies cascading of multiple stages by directly interconnecting the cascaded stages without the need for additional circuitry to achieve arbitrary multiplication factors.

Another objective of the present invention is to provide the output quadrature components I and Q of the multiplied signal for use as a source of quadrature signals to be utilized by other components in the system.

Yet another objective of the present invention is to provide a programmable frequency multiplier method and apparatus which provides for fast acquisition of the input signal and provides the in-phase and quadrature components of the output multiplied signal with minimal delay, using little or no filtering thus not slowing down the acquisition and multiplication process.

It is further an objective of the present invention to provide a programmable frequency multiplier method and apparatus which achieves low radiated and conducted EMI emissions in order to reduce unwanted signal coupling or ingress into other circuits in densely populated designs, such as in monolithic ICs.

It is yet another objective of the present invention to achieve the above objectives in a manner enabling a simple design and implementation in integrated circuits (ICs) without using external components such as bulky coils and capacitors and without a need for any adjustments, tweaking or calibration during production.

Accordingly, the present invention relates to a programmable frequency multiplier device which comprises a frequency doubler section configured to receive an input signal having a frequency f, and to output a plurality of doubled signals, each of the plurality of doubled signals having a frequency $2^n \times f$ (n=0, 1, 2, ... ); a selector section configured to select a plurality of the doubled signals output from the frequency doubler section, and to output the plurality of the selected doubled signals as selected signals; and a frequency summation section configured to multiply the selected signals, and to output a multiplied signal having a frequency $f_{out}=f \times (m_0 2^0 + m_1 2^1 + \ldots + m_k 2^k + \ldots + m_n 2^n)$, wherein $m_k=0$ or 1, and k=0, 1, . . . , n.

The present invention also relates to a programmable frequency multiplier device which comprises a first series of Complex Frequency Shifters (CFS's) being coupled in a cascaded chain having n (n=1, 2, 3, . . . ) stages, wherein a first CFS at a first stage of the first series is configured to receive an input signal having a frequency f and to output a first output signal in the first series having a frequency 2×f, and each of a $h^{th}$ CFS at a $h^{th}$ (h=2, 3, 4, . . . , n) stage of the first series is configured to receive a $(h-1)^{th}$ output signal in the first series from a $(h-1)^{th}$ CFS of the first series and to output a $h^{th}$ output signal in the first series having a frequency $2^h \times f$; a series of switches comprising n+1 switches, each of the switches constituting a $m^{th}$ stage (m=0, 1, 2, . . . , n), wherein a primary switch at a primary stage (m=0) is configured to select between the input signal and a predetermined signal and to output a primary selected signal, and wherein each of a $m^{th}$ switch at a $m^{th}$ stage (m=1, 2, 3, . . . , n) is configured to select the $m^{th}$ output signal in the first series from the $m^{th}$ CFS of the first series and the predetermined signal and to output a $m^{th}$ selected signal; and a second series of CFS's being coupled in a cascaded chain having n (n=1, 2, 3, . . . ) stages, wherein a first CFS at a first stage of the second series is configured to receive the primary selected signal from the primary switch and a first selected signal from a first switch and to output a first output signal in the second series, and wherein each of a $h^{th}$ CFS at a $h^{th}$ (h=2, 3, 4, . . . , n) stage of the second series is configured to receive a $(h-1)^{th}$ output signal in the second series from a $(h-1)^{th}$ CFS of the second series and a $h^{th}$ selected signal from a $h^{th}$ switch and to output a $h^{th}$ output signal in the second series.

Further, the present invention relates to a method of performing frequency multiplication which comprises receiving a complex input signal, the complex input signal having a frequency f, the input signal corresponding to a $0^{th}$ signal; generating a $n^{th}$ signal having a frequency $2^n \times f$ (n=1, 2, . . . ); selecting between a $h^{th}$ signal (h=0, 1, 2, . . . , n) having a frequency of $2^h \times f$ and a predetermined signal, and outputting the $h^{th}$ selected signal; multiplying all of the $h^{th}$ selected signals (h=0, 1, 2, . . . , n); and outputting an output signal having a frequency $f_{out}=f \times (m_0 2^0 + m_1 2^1 + \ldots + m_k 2^k + \ldots + m_n 2^n)$, wherein $m_k=0$ or 1, and k=0, 1, . . . , n.

Among other advantages, as noted below, the programmable frequency multiplier device of the present invention provides a low noise device suitable for IC integration and capable of covering extremely wide frequency range from near DC to near maximum frequency of operation of active devices (e.g. close to a transition frequency $f_T$ of IC processes) in the multi-GHz range, thus offering significant performance advantages in frequency synthesis as a reference signal, stand-alone LO signal source or a low jitter clock for ADCs or DACs in many applications ranging from high speed digital communications in CATV to wireless communications and other modern consumer and commercial electronics devices. Additional advantages of the present invention will become apparent to those skilled in the art from the following detailed description of exemplary embodiments of the present invention.

The invention itself together with further objects and advantages, can be better understood by reference to the following detailed description and the accompanying drawings.

BRIEF DESCRIPTION OF THE DRAWINGS

FIG. 3b is a simplified block diagram of the CFS multiplier illustrated in FIG. 3a.

DETAILED DESCRIPTION OF THE INVENTION

Figure 1:
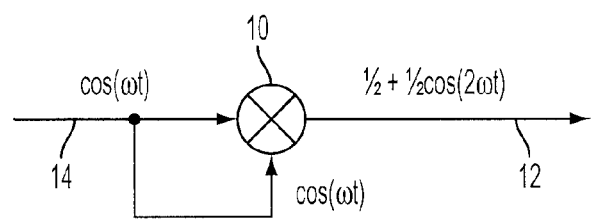
FIG. 1 is a block diagram of a first prior art frequency multiplication circuit.
Figure 2:
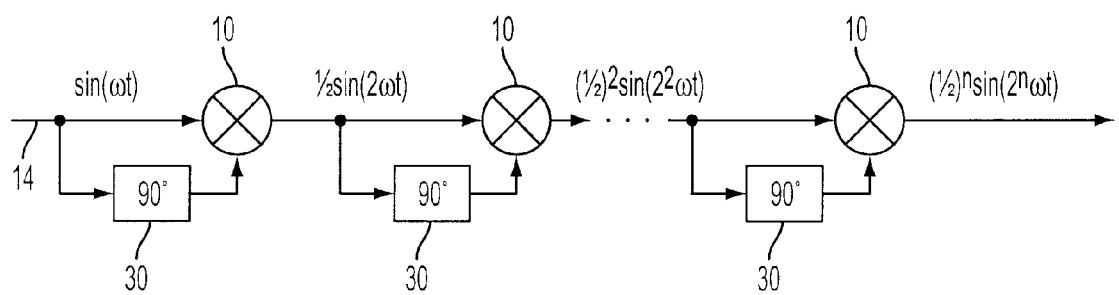
FIG. 2 is a block diagram of a second prior art frequency multiplication circuit.
Figure 3A:
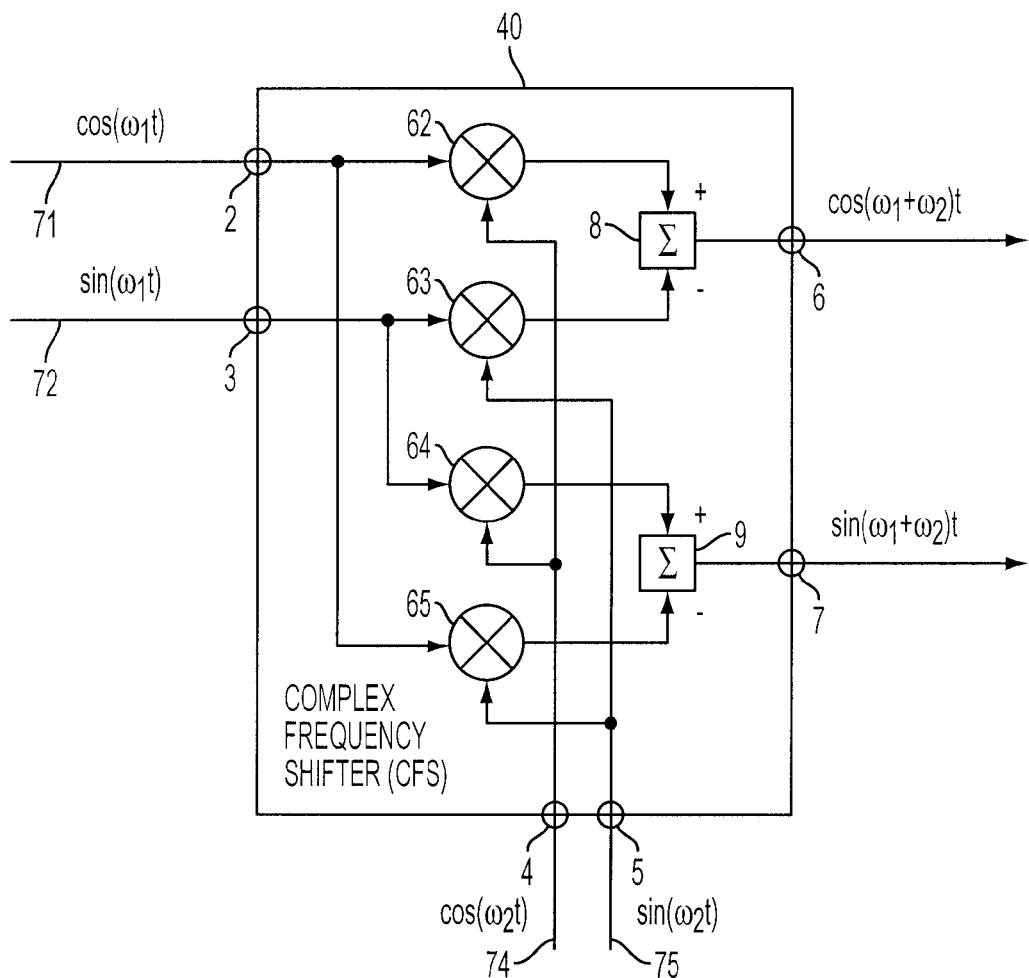
FIG. 3a is an exemplary block diagram of an embodiment of a complex frequency shifter "CFS" in accordance with the present invention.

FIG. 3a is an exemplary block diagram of the complex frequency shifter (CFS) 40 utilized in the present invention. In general, the CFS circuit 40 provides a sum of two frequencies. When a first complex signal having the in-phase component $\cos(\omega_1 t)$ and the quadrature component $\sin(\omega_1 t)$ is applied to the input port 2 and 3 of the CFS 40, respectively, and a second complex signal having the in-phase component $\cos(\omega_2 t)$ and the quadrature component $\sin(\omega_2 t)$ is applied to the input ports 4 and 5 of the CFS 40, respectively, the CFS circuit 40 performs frequency summation and provides at the output ports the sum output signal with a sum frequency $\omega_1+\omega_2$. In the given embodiment, the sum output signal is also complex, having two components in phase and quadrature, i.e., $\cos(\omega_1+\omega_2)t$ and $\sin(\omega_1+\omega_2)t$.

More specifically, in the given embodiment, the CFS circuit 40 includes four individual multipliers 62, 63, 64 and 65, wherein the multipliers 62 and 65 are configured to receive a first component 71 of a first input signal, and the multipliers 63 and 64 are configured to receive a second component 72 of a second input signal. Further, the multipliers 62 and 64 are configured to receive a first component 74 of the second input signal, and the multipliers 63 and 65 are configured to receive a second component 75 of the second input signal. For example, the first component 71 of the first input signal and the second component 72 of the first input signal may be $\cos(\omega_1 t)$ and $\sin(\omega_1 t)$, respectively, and the first component 74 of the second input signal and the second component 75 of the second input signal may be $\cos(\omega_2 t)$ and $\sin(\omega_2 t)$, respectively.

The outputs of multipliers 62 and 63 are coupled to a first summer circuit 8 and the outputs of multipliers 64 and 65 are coupled to a second summer circuit 9. The outputs of the summers 8 and 9 represent the output of the CFS 40. It is noted that the summers may operate as an adder and/or subtracter. It is also noted that other circuit configurations can also be utilized to implement the functionality of the CFS 40.

Turning to the operation, the CFS 40 is configured to perform a complex up-conversion to the upper sideband "USB." In other words, to produce the sum of the two input frequencies, which is determined by the polarity choice of the signal of summer circuits 8 and 9. For the desired up-conversion, the summer 8 provides the difference signal, while the summer 9 provides the sum signal as shown in FIG. 3a. As noted, the CFS 40 has two pairs of complex inputs (i.e., inputs (2 and 3) and (4 and 5)) and one pair of complex output (outputs 6 and 7). Each complex input consists of a pair of ports: the in-phase I port and the quadrature Q port. The complex output port also consists of an I port (6) and a Q port (7). The first complex input is at ports 2 and 3, where port 2 is the I input port and port 3 is Q input port. The second complex input is at ports 4 and 5, port 4 being the I input port and port 5 the Q input port. The complex output consists of port 6, the I output, and of port 7, the Q output.

The frequency summation by the CFS 40 is realized by connecting the input ports 2 and 3 of the CFS 40 to the first input signal and the other pair of input ports 4 and 5 to the second input signal, respectively, as shown in FIG. 3a. It is noted that the CFS 40 of the given embodiment utilizes two input signals in quadrature to operate. These signals are provided from an external source to the circuit. When a first complex signal having the in-phase component $\cos(\omega_1 t)$ and the quadrature component $\sin(\omega_1 t)$ and a second complex signal having the in-phase component $\cos(\omega_2 t)$ and the quadrature component $\sin(\omega_2 t)$ are applied to the input ports of the CFS circuit 40 of FIG. 3a, the circuit CFS 40 performs frequency summation and at the output ports provides the output having the sum frequency $\omega_1 + \omega_2$. The summed output signal is also complex and has two components: the in-phase multiplied signal $\cos(\omega_1 + \omega_2)t$ at port 6 and the quadrature multiplied signal $\sin(\omega_1 + \omega_2)t$ at port 7.

Specifically, with the input signal expressed in the phasor form using Euler's formula:

$$e^{j\omega_1 t} = \cos \omega_1 t + j \sin \omega_t \text{ at complex port (2,3), and} \quad (1)$$

$$e^{j\omega_2 t} = \cos \omega_2 t + j \sin \omega_2 t \text{ at complex port (4,5),} \quad (2)$$

the summed signal at the output of the CFS circuit 40 can also be expressed in a complex form:

$$e^{j(\omega_1+\omega_2)t} = \cos(\omega_1+\omega_2)t + j \sin(\omega_1+\omega_2)t \text{ at complex port (6,7)} \quad (3).$$

Equations (1), (2) and (3) express the canonical operation of the CFS circuit 40, which takes the input complex signals $e^{j\omega_1 t}$ and $e^{j\omega_2 t}$, operates on its argument and delivers the summation complex signal $e^{j(\omega_1+\omega_2)t}$ at the output. The magnitude of the output signal is unity, equal to that of the input, representing a property of unity gain of the CFS circuit 40. The real and imaginary components of the output complex signal in Eq. (3), representing the in-phase I and the quadrature Q components of the multiplied output, are in quadrature. The phases of the output components with respect to each other and with respect to the input signals are defined per Eqs. (1), (2) and (3): the output signal at port 6 providing the output's real component $\cos(\omega_1+\omega_2)t$ is in-phase (0°) with respect to the input in-phase component $\cos(\omega_1 t)$; and the signal at output port 7 of $\sin(\omega_1+\omega_2)t$ lags behind the in-phase signal at port 6 by 90°. In the actual circuit, a small phase delay of the output signal with respect to the input signals will occur due to the propagation delay time $\tau$ through the circuit.

The provision of the quadrature components at the output of the CFS circuit 40 represents a powerful feature of the present invention. More specifically, the I and Q quadrature components of the multiplied signal may be utilized as a quadrature source for other elements contained within the system. For example, the quadrature signal output by the CFS circuit 40 can be used to drive an I, Q modulator stage in a transmitter application, or an I, Q demodulator in a receiver application as a quadrature local oscillator (LO), replacing the often utilized poly-phase filters commonly used to derive quadrature components.

Considering a case with ideal operation (i.e., a pure multiplied sinusoidal signal per Eq. (3)), there would be no unwanted images or sidebands at the output and no additional filtering would be required, the principal advantage of the complex multiplication compared with a single-dimensional operation. Of course, a pure sine-wave per Eq. (3) implying a perfect linearity, signal balance and isolation generally cannot currently be realized. In the practical circuit design harmonic distortion will typically occur due to nonlinearity in multipliers 62-65. The level of distortion typically depends on the nonlinearity in conjunction with the applied signal levels. In general, the level of higher frequency harmonic energy with the present invention circuit will be far below the desired signal, easily a few orders of magnitude lower. In addition to providing a spectrally cleaner signal, low harmonic content with the present invention circuit will result in low radiated and conducted EMI emissions advantageous in reducing or eliminating unwanted signal coupling or ingress into other circuits in densely populated designs, such as in monolithic ICs.

It is further noted that due to other circuit imperfections such as imbalances of amplitude and phase in the I and Q arms, there may be other unwanted terms, such as images, input signal leakages, etc., present at the output signal. The quality of the output signal will also depend on the phase and amplitude balance of the input quadrature signals provided externally to the circuit. In a typical IC circuit, the image suppression and the input signal leakage terms will be on the order of 35 dBc to 40 dBc below the desired signal. Depending on the system requirements and the application, some filtering of these terms may be necessary.

Figure 3B:
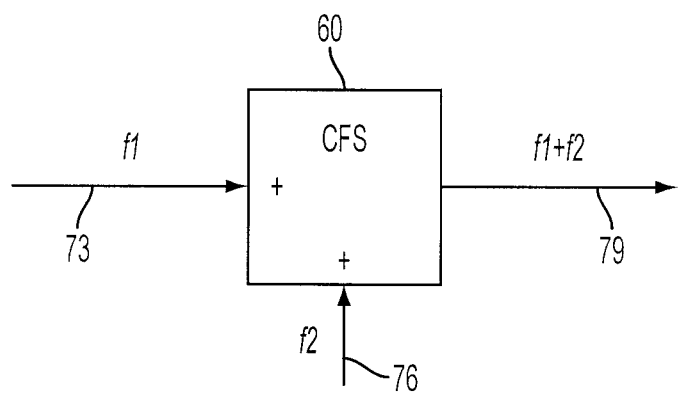

As noted above, FIG. 3b is a simplified representation of the CFS circuit shown in FIG. 3a, depicting the basic summation property of the CFS circuit 40 in a simplified manner. Referring to FIG. 3b, the mixer and summer circuits of the CFS circuit are represented as a box labeled "CFS" 40. In addition, the complex input and output ports, consisting of two ports each in FIG. 3a, are represented with a single line for the purpose of simplification in the diagram of FIG. 3b. It should be noted that each of the lines 73, 76 and 79 represents a complex single line, consisting of two different signal lines, the in-phase or cosine and the quadrature or sine signal line, each connected to the corresponding I, Q port pair of the CFS circuit 40 of FIG. 3a. The plus signs inside the box 40 indicate that the frequencies at the corresponding ports are added at the output. As shown, the input frequency $f_1$ at the input 73 and $f_2$ at the input 76 are added to $f_1+f_2$ at the output 79.

Figure 4:
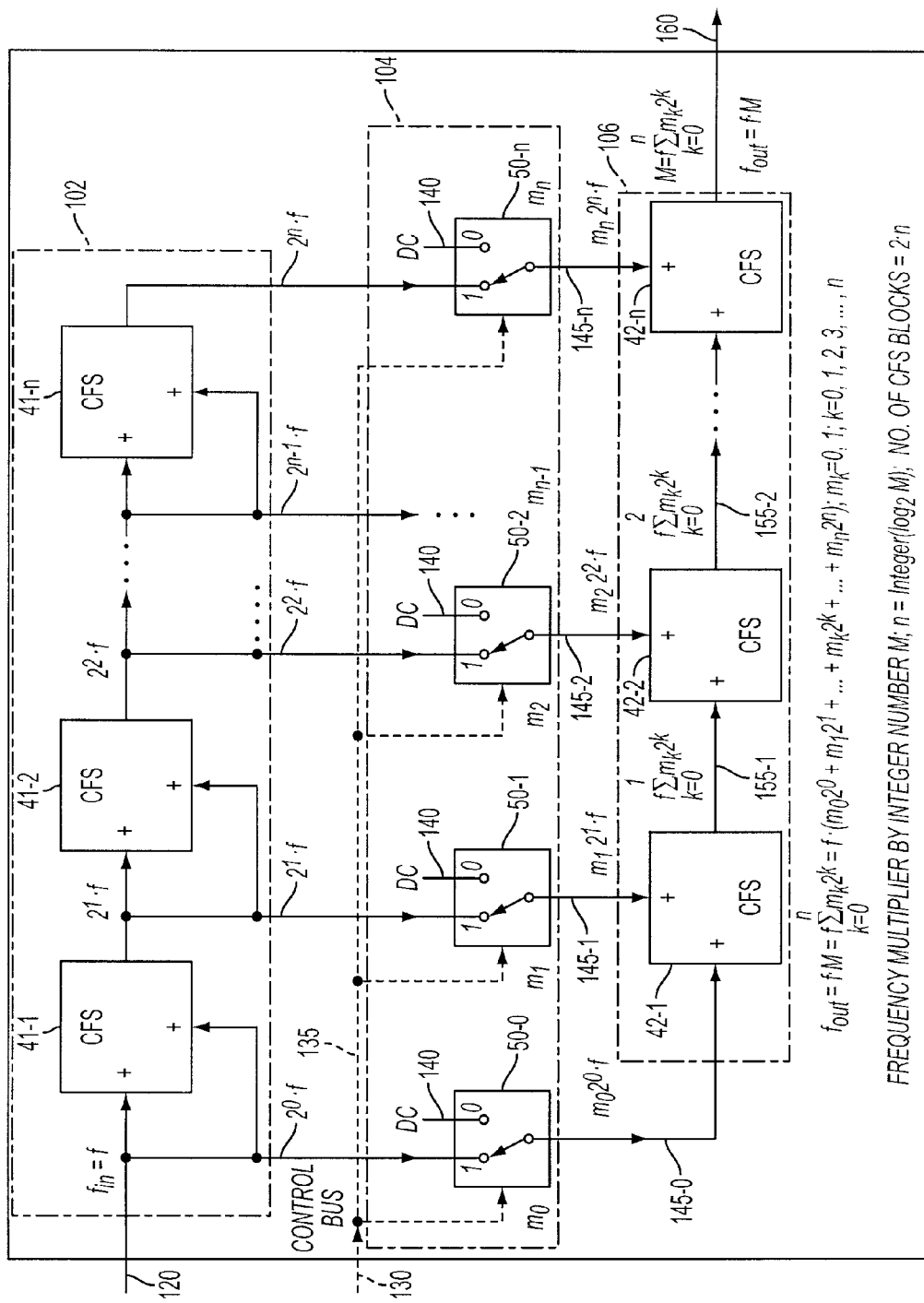
FIG. 4 is an exemplary block diagram of a first embodiment in accordance with the present invention.

The quadrature signal can also be utilized in conjunction with the direct cascading of multiple CFS 40 stages, for example, as shown in FIG. 4, which is an example of a first embodiment of the present invention, to obtain arbitrary multiplication factors. Such a cascaded configuration can be utilized, for example, in a synthesizer application as an LO signal. Unlike the prior art devices, the quadrature phase relationship is preserved in the cascaded CFS configuration from stage to stage, i.e. the quadrature relationship "propagates" through the system and need not be recreated again anywhere within the chain. Thus, the cascading can be easily accomplished by simply connecting the output ports of one stage to the corresponding input ports of the next stage. More specifically, the cascaded configuration is obtained by connecting the complex output port (6, 7) of a first CFS to the input complex ports (2, 3 and 4, 5) of the next stage (i.e., a second CFS) and so on. It is noted that the cascaded configuration shown in FIG. 4 utilizes the simplified block diagram of the present invention CFS as shown in FIG. 3b.

As noted, FIG. 4 is an exemplary block diagram of a programmable frequency multiplication device 100. In the given embodiment, the programmable frequency multiplication device 100 comprises a frequency doubler section 102, a selector section 104 and a frequency summation section 106. In FIG. 4, as the frequency doubler section, a first series of CFS's 41-1, 41-2, . . . , 41-n is provided. The first series of CFS's are coupled in a cascaded chain having n (n=1, 2, 3, . . . ) stages. The first CFS 41-1 at the first stage of the first CFS series is configured to receive an input complex signal 120 having a frequency of f ($f=f_{in}$) at its first input port (2, 3) and second input port (4, 5) to operate as a frequency doubler. Each of a $h^{th}$ CFS (h=2, 3, . . . , n) of the first series at the $h^{th}$ stage is configured to receive a $(h-1)^{th}$ output signal in the first CFS series output from a $(h-1)^{th}$ CFS of the first CFS series at its first input port (2, 3) and second input port (4, 5), so as to operate as a frequency doubler. Thus, each of the output signals of the $h^{th}$ CFS (h=1, 2, . . . , n) in the first series of CFS has a frequency of $2^h \times f_{in}$ (h=1, 2, . . . , n). It is noted that CFS circuit 40 shown in FIG. 3a may be used as one of the first series of CFS's.

Each of the output signals of the $h^{th}$ CFS (h=1, 2, . . . , n) in the first CFS series is directed to the selector section 104, which in the given embodiment comprises a series of switches. The number of the switches are (n+1) and the each of the switches constitutes a $m^{th}$ stage (m=0, 1, 2 . . . , n). In FIG. 4, each of the $m^{th}$ switch at the $m^{th}$ stage is labeled 50-m (m=0, 1, 2, . . . , n). The $0^{th}$ switch, a primary switch 50-0, is configured to receive the input signal 120 and a predetermined signal, for example a DC signal 140. It is noted that the input signal 120 directed to the primary switch 50-0 has a frequency $f_{in}$, and may be output from the frequency doubler section 102 by bypassing the CFS's. The primary switch 50-0 may select between the input signal 120 and the DC signal 140 by a control signal 130 so as to output either of them as a primary selected signal. Each of the rest of the switches is configured to receive the $m^{th}$ output signal (m=1, 2, 3, . . . , n) from the $m^{th}$ CFS in the first CFS series and the DC signal 140. For example, the $m^{th}$ switch may receive the $m^{th}$ output signal from the $m^{th}$ CFS in the first CFS series (m=1, 2, 3, . . . , n). The $m^{th}$ switch is configured to select the $m^{th}$ output signal or the DC signal 140 by a control signal 130 so as to output either of them as a $m^{th}$ selected signal. The control signal 130 is provided via a control bus line 135 and is programmable so as to determine which switches should output the signals from the CFS in the first series.

Then, the selected signals from each of the switches are directed to the frequency summation section 106, which in the given embodiment comprises a second series of CFS's, to sum the selected signals. The CFS's in the second CFS series are coupled in a cascaded chain having n (n=1, 2, 3, . . . ) stages. The first CFS 42-1 at the first stage (n=1) of the second CFS series is configured to receive the primary selected signal 145-0 and the first selected signal 145-1 so as to output a first output signal 155-1 in the second CFS series. It is noted that the primary selected signal 145-0 may be coupled to the first input complex ports (2, 3) of the CFS 42-1 and the first selected signal 145-1 may be coupled to the second input complex ports (4, 5) (or vice versa), and the output signal 155-1 from the first CFS 42-1 is a multiplication of the first selected signal 145-1 and the output signal 155-1.

The $h^{th}$ CFS at the $h^{th}$ stage of the second CFS series is configured to receive a $(h-1)^{th}$ sum output from the $(h-1)^{th}$ CFS in the second CFS series and the $h^{th}$ selected signal from the $h^{th}$ switch so as to output a $h^{th}$ sum output (h=2, 3, . . . , n). It is noted that the $h^{th}$ selected signal may be coupled to the second input complex ports (2, 3) of the CFS and the $(h-1)^{th}$ sum output may be coupled to the first input complex ports (4, 5) (or vice versa), and the output signal from the $h^{th}$ CFS in the second CFS series is a multiplication of the $h^{th}$ selected signal and the $(h-1)^{th}$ sum output (h=2, 3, . . . , n). It is noted that CFS circuit 40 shown in FIG. 3a may be used for the second series of CFS's.

Thus, a frequency of the output signal 160 of the programmable frequency multiplication device 100 can be described as:

$$f_{out}=f_{in} \times (m_0 2^0 + m_1 2^1 + \ldots + m_k 2^k + \ldots + m_n 2^n),$$
wherein $m_k$=0 or 1, and k=0, 1, . . . , n. (4).

As shown by this equation (4), it is noted that the programmable frequency multiplication device 100 operates as a frequency multiplier with arbitrary integer factors. In the present invention, multiplication by any integer number between 0 and $M=2^{n+1}-1$ in increments of 1 can be realized. In other words, the required number of CFS circuits is 2×Integer($\log_2$ M). In addition, it is noted that since $m_k$ in the equation (4) represents the switching status of $k^{th}$ switch and is programmable by, for example, the programmable control signal 130, the multiplication factor of the frequency multiplication device 100 is programmable. It is noted that the entire circuit or the part of circuit of the device 100 may be integrated in an IC.

Figure 5:
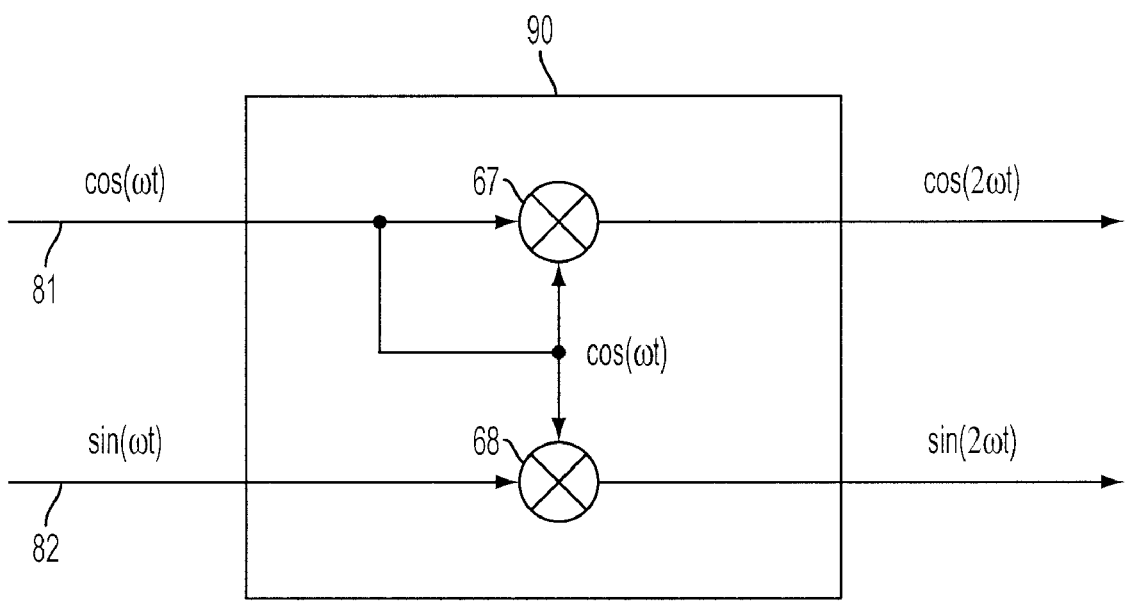
FIG. 5 is an exemplary block diagram of a frequency doubler circuit in accordance with the present invention.

In another embodiment of the present invention, at least one of the CFS circuits in the first CFS series may be replaced with a reduced complexity frequency doubler circuit shown in FIG. 5. In FIG. 5, a reduced complexity frequency doubler circuit 90 comprises a first multiplier 67 having a first input port and a second input port and a second multiplier 68 having a first input port and a second input port. The first component 81 of the input signal, represented by cos(ωt), is directed to the first input port and the second input port of the first multiplier 67. The second component 82 of the input signal, represented by sin(ωt), is directed to the first port of the second multiplier 68 and the first component 81 of the input signal is directed to the second port of the second multiplier

68. The multipliers 67 and 68 output signals cos(2ωt) and sin(2ωt), respectively. As shown in FIG. 5, the circuit 90 may operate as a frequency doubler and thus may reduce the complexity of the programmable frequency multiplier 100 by replacing at least one of the CFS's in the first CFS series.

The acquisition of the multiplication signal and subsequent delivery of the multiplied signals at the output of both the in-phase and quadrature components is very fast, on the order of the propagation delay time τ through the circuit. With high frequency IC processes, the time delay τ can be extremely small. For example, with $f_T$ of 25 GHz, the delay τ is on the order of a few tens of picoseconds. The fast response of the CFS circuit 40 is possible because there are no other delay mechanisms (such as filter delays or similar) in the circuit besides the core delay τ to slow the signal down, as is the case with some prior art solutions. Thus, the quadrature components I and Q of the multiplied signal of CFS circuit 40 will be generated and provided at the output very fast, substantially instantaneously upon application of the input signal (to the extent of the speed of generation and availability of the quadrature signals at the input) incurring only minimum delay equal to the propagation delay τ. This is a valuable feature for applications requiring very fast frequency hopping, such as in spread-spectrum systems and other fast signal switching applications.

Another advantage associated with the present invention is that very low phase-noise and broadband noise are achievable with the CFS circuit 40. The output noise in the CFS circuit 40 is a function of the following factors: the noise figures of the input ports, the magnitude of the signal levels applied to these ports and the effects of the multiplication process. The CFS circuit's close-in phase-noise is governed by the close-in flicker noise of the mixers, while the broadband noise of the CFS circuit is governed by the noise figure of the mixers. Particularly suitable mixers providing low noise and high signal level capability for use in the present invention include, but are not limited to, analog or RF types such as single or double-balanced mixers with diodes or active-switches, and Gilbert-cell based mixers. It is noted that very low noise figures and flicker noise levels are achievable with mixers, including the ones integrated in ICs implementation, with low noise figures resulting in noise floors not far from the thermal noise of −174 dBm/Hz and very low flicker noise corners below 1 kHz, providing extremely low close-in phase noise. By using mixers with higher compression points capable of handling high signal levels and increasing the signal drive levels it is possible with the CFS circuit 40 to achieve a very high output SNR in excess of 170 dBc/Hz.

As is known, frequency multiplication increases the noise. For example, frequency doubling increases the phase noise voltage by a factor of 2 (this is because doubling of the frequency also doubles the index of phase modulation caused by noise, thus doubling the noise voltage) which translates to 4 times or 6 dB of the phase noise power increase. The phase noise in general represents only half of the broadband noise power and the other half is the amplitude noise. Due to a signal limiting that may occur in the present invention frequency multiplier, some of the amplitude noise may be converted to phase noise, making the phase noise dominant. When multiple CFS circuits 40 are connected in a cascaded configuration as shown for example in FIG. 4 for arbitrary integer factors, the output noise is dominated by the noise power of the first stage in the cascaded chain which gets multiplied by the square of the cascade's frequency multiplication ratio.

The present invention provides numerous advantages over prior art frequency multiplier circuits. Most importantly, the present invention provides a circuit which provides for low noise frequency multiplication by a large (or small) ratio (i.e., multiplication factor) for use, for example, to generate high-frequency low-jitter clock signals. Importantly, the circuit provides for both low phase noise and low broadband noise.

Further, the present invention provides a frequency multiplier where the multiplication factor can be programmed so as to obtain arbitrary integer factors.

Another advantage associated with the present invention is that it provides a frequency multiplier method and apparatus which achieves very wide frequency range of operation from low frequencies near DC to very high frequencies close to the transition frequency $f_T$ of the active devices utilized.

Another advantage of the present invention is that it provides a frequency multiplier method and apparatus which simplifies cascading of multiple stages by directly interconnecting the cascade stages without the need for additional circuitry to achieve higher multiplication ratios.

Yet another advantage of the present invention is that it provides the output quadrature components I and Q of the multiplied signal for use as a source of quadrature signals to be utilized by other component in the system.

Yet another advantage of the present invention is that it provides a frequency multiplier method and apparatus which provides for fast acquisition of the input signal and provides the in-phase and quadrature components of the output multiplied signal with minimal delay, using little or no filtering thus not slowing down the acquisition and multiplication process.

Yet another advantage of the present invention is that it provides a frequency multiplier method and apparatus which achieves low radiated and conducted EMI emissions in order to reduce unwanted signal coupling or ingress into other circuits in densely populated designs, such as in monolithic ICs.

Although certain specific embodiments of the present invention have been disclosed, it is noted that the present invention may be embodied in other forms without departing from the spirit or essential characteristics thereof. Thus, the present embodiments are therefore to be considered in all respects as illustrative and not restrictive, the scope of the invention being indicated by the appended claims, and all changes that come within the meaning and range of equivalency of the claims are therefore intended to be embraced therein.

I claim:

1. A programmable frequency multiplier device, comprising:
    a frequency doubler section configured to receive an input signal having a frequency f, and to output a plurality of doubled signals, each of the plurality of doubled signals having a frequency $2^n \times f$ (n=0, 1, 2, ...);
    a selector section configured to select a plurality of the doubled signals output from the frequency doubler section, and to output the plurality of the selected doubled signals as selected signals; and
    a frequency summation section configured to multiply the selected signals, and to output a multiplied signal having a frequency $f_{out} = f \times (m_0 2^0 + m_1 2^1 + \ldots + m_k 2^k + \ldots + m_n 2^n)$, wherein $m_k$=0 or 1, and k=0, 1, ..., n.

2. The programmable frequency multiplier device of claim 1,
    wherein the frequency doubler section comprises n frequency doublers coupled in a cascaded chain, each of the frequency doublers constituting a $h^{th}$ stage (h=1, 2, ..., n), and wherein each $h^{th}$ frequency doubler at the $h^{th}$ stage (h=1, 2, ..., n) is configured to receive a signal having a frequency $2^{(h-1)} \times f$ and to output the doubled signal having a frequency $2^h \times f$.

3. The programmable frequency multiplier device of claim 2, wherein at least one of the frequency doublers comprises:
a first multiplier configured to receive a first component of a first input signal and a first component of a second input signal and to output a first multiplied signal;
a second multiplier configured to receive a second component of the first input signal and a second component of the second input signal and to output a second multiplied signal;
a third multiplier configured to receive the second component of the second input signal and the first component of the first input signal and to output a third multiplied signal;
a fourth multiplier configured to receive the first component of the first input signal and the second component of the second input signal and to output a fourth multiplied signal;
a first summer configured to receive the first and second multiplied signals and to output a first component of an output complex signal; and
a second summer configured to receive the third and fourth multiplied signals and to output a second component of the output complex signal.

4. The programmable frequency multiplier device of claim 2, wherein at least one of the frequency doublers comprises:
a first summer having a first input port and a second input port and being configured to receive a first input signal at the first input port and at the second input port; and
a second summer having a first input port and a second input port and being configured to receive a second input signal at the first input port and the first input signal at the second input port.

5. The programmable frequency multiplier device of claim 1,
wherein the selector section comprises n+1 switches, each of the switches constituting a $m^{th}$ stage (m=0, 1, 2, ..., n), and
wherein each $m^{th}$ switch at the $m^{th}$ stage (m=0, 1, 2, ..., n) is configured to receive the doubled signal having a frequency $2^m \times f$ from the frequency doubled section and a predetermined signal, and to select and output either of the doubled signal having a frequency $2^m \times f$ or the predetermined signal as a $m^{th}$ selected signal.

6. The programmable frequency multiplier device of claim 5, wherein the predetermined signal is a DC signal.

7. The programmable frequency multiplier device of claim 5, wherein each of the switches is configured to be controlled by a programmable control signal.

8. The programmable frequency multiplier device of claim 1,
wherein the frequency summation section comprises n frequency combiners coupled in a cascaded chain, each of the frequency combiners constituting a $h^{th}$ stage (h=1, 2, ..., n), and
wherein at least one of the frequency combiners is configured to receive a first complex signal having a first frequency $f_1$ and a second complex signal having a second frequency $f_2$, and to output a sum signal having a sum frequency $f_1+f_2$.

9. The programmable frequency multiplier device of claim 8, wherein at least one of the frequency combiners comprises:
a first multiplier configured to receive a first component of a first input signal and a first component of a second input signal and to output a first multiplied signal;
a second multiplier configured to receive a second component of the first input signal and a second component of the second input signal and to output a second multiplied signal;
a third multiplier configured to receive the second component of the second input signal and the first component of the first input signal and to output a third multiplied signal;
a fourth multiplier configured to receive the first component of the first input signal and the second component of the second input signal and to output a fourth multiplied signal;
a first summer configured to receive the first and second multiplied signals and to output a first component of an output complex signal; and
a second summer configured to receive the third and fourth multiplied signals and to output a second component of the output complex signal.

10. A programmable frequency multiplier device, comprising:
a first series of Complex Frequency Shifters (CFS's) being coupled in a cascaded chain having n (n=1, 2, 3, ...) stages, wherein a first CFS at a first stage of the first series is configured to receive an input signal having a frequency f and to output a first output signal in the first series having a frequency 2×f, and each of a $h^{th}$ CFS at a $h^{th}$ (h=2, 3, 4, ..., n) stage of the first series is configured to receive a $(h-1)^{th}$ output signal in the first series from a $(h-1)^{th}$ CFS of the first series and to output a $h^{th}$ output signal in the first series having a frequency $2^h \times f$;
a series of switches comprising n+1 switches, each of the switches constituting a $m^{th}$ stage (m=0, 1, 2, ..., n), wherein a primary switch at a primary stage (m=0) is configured to select between the input signal and a predetermined signal and to output a primary selected signal, and wherein each of a $m^{th}$ switch at a $m^{th}$ stage (m=1, 2, 3, ..., n) is configured to select the $m^{th}$ output signal in the first series from the $m^{th}$ CFS of the first series and the predetermined signal and to output a $m^{th}$ selected signal; and
a second series of CFS's being coupled in a cascaded chain having n (n=1, 2, 3, ...) stages, wherein a first CFS at a first stage of the second series is configured to receive the primary selected signal from the primary switch and a first selected signal from a first switch and to output a first output signal in the second series, and wherein each of a $h^{th}$ CFS at a $h^{th}$ (h=2, 3, 4, ..., n) stage of the second series is configured to receive a $(h-1)^{th}$ output signal in the second series from a $(h-1)^{th}$ CFS of the second series and a $h^{th}$ selected signal from a $h^{th}$ switch and to output a $h^{th}$ output signal in the second series.

11. The programmable frequency multiplier device of claim 10, wherein at least one of the switches is configured to be controlled by a control bus and be programmable.

12. The programmable frequency multiplier device of claim 10, wherein at least one of the first series of CFS's comprises:
a first summer having a first input port and a second input port and being configured to receive a first input signal at the first input port and at the second input port; and
a second summer having a first input port and a second input port and being configured to receive a second input signal at the first input port and the first input signal at the second input port.

13. The programmable frequency multiplier device of claim 10, wherein at least one of the first or second series of CFS's comprises:
- a first multiplier configured to receive a first component of a first input signal and a first component of a second input signal and to output a first multiplied signal;
- a second multiplier configured to receive a second component of the first input signal and a second component of the second input signal and to output a second multiplied signal;
- a third multiplier configured to receive the second component of the second input signal and the first component of the first input signal and to output a third multiplied signal;
- a fourth multiplier configured to receive the first component of the first input signal and the second component of the second input signal and to output a fourth multiplied signal;
- a first summer configured to receive the first and second multiplied signals and to output a first component of an output complex signal; and
- a second summer configured to receive the third and fourth multiplied signals and to output a second component of the output complex signal.

14. A method of performing frequency multiplication, comprising:
- receiving a complex input signal, the complex input signal having a frequency f, the input signal corresponding to a $0^{th}$ signal;
- generating a $n^{th}$ signal having a frequency $2^n \times f$ (n=1, 2, ...);
- selecting between a $h^{th}$ signal (h=0, 1, 2, ..., n) having a frequency of $2^h \times f$ and a predetermined signal, and outputting the $h^{th}$ selected signal;
- multiplying all of the $h^{th}$ selected signals (h=0, 1, 2, ..., n); and
- outputting an output signal having a frequency $f_{out} = f \times (m_0 2^0 + m_1 2^1 + \ldots + m_k 2^k + \ldots + m_n 2^n)$, wherein $m_k = 0$ or 1, and k=0, 1, ..., n.

15. The method of performing frequency multiplication of claim 14,
- wherein the generating a $n^{th}$ signal having a frequency $2^n \times f$ (n=1, 2, ... ) is performed by a series of frequency doublers being coupled in a cascaded chain and having n stages, and
- wherein each of a $h^{th}$ frequency doubler at the $h^{th}$ stage (h=1, 2, ..., n) outputs the $h^{th}$ signal having a frequency $2^h \times f$.

16. The method of performing frequency multiplication of claim 14,
- wherein the multiplying the $h^{th}$ selected signals (h=0, 1, 2, ..., n) is performed by a series of frequency combiners being coupled in a cascaded chain, having n stages,
- wherein a first frequency combiner at a first stage of the series of frequency combiners is configured to multiply a $0^{th}$ selected signal and a first selected signal, and
- wherein each of a $h^{th}$ frequency combiner at the $h^{th}$ stage (h=2, 3, ..., n) of the series of frequency combiners is configured to multiply a $(h-1)^{th}$ output signal from a $(h-1)^{th}$ frequency combiner of the series of frequency combiners with the $h^{th}$ selected signal.

17. The method of performing frequency multiplication of claim 14,
- wherein the selecting between a $h^{th}$ signal (h=0, 1, 2, ..., n) having a frequency of $2^h \times f$ and a predetermined signal is performed by a series of switches, each of the switches constituting a $m^{th}$ stage (m=0, 1, 2, ..., n), and
- wherein each of a $m^{th}$ switch at the $m^{th}$ stage (m=0, 1, 2, ..., n) is configured to select and output one of the $m^{th}$ signal having a frequency $2^m \times f$ (m=0, 1, 2, ..., n) and a DC signal.

18. The method of performing frequency multiplication of claim 17, wherein the series of switches are configured to be controlled by a programmable control bus.

19. The method of performing frequency multiplication of claim 15, wherein at least one of the frequency doublers in the series of frequency doublers comprises:
- a first summer having a first input port and a second input port and being configured to receive a first input signal at the first input port and at the second input port; and
- a second summer having a first input port and a second input port and being configured to receive a second input signal at the first input port and the first input signal at the second input port.

20. The method of performing frequency multiplication of claim 15, wherein at least one of the frequency doublers in the series of frequency doublers comprises:
- a first multiplier configured to receive a first component of a first input signal and a first component of a second input signal and to output a first multiplied signal;
- a second multiplier configured to receive a second component of the first input signal and a second component of the second input signal and to output a second multiplied signal;
- a third multiplier configured to receive the second component of the second input signal and the first component of the first input signal and to output a third multiplied signal;
- a fourth multiplier configured to receive the first component of the first input signal and the second component of the second input signal and to output a fourth multiplied signal;
- a first summer configured to receive the first and second multiplied signals and to output a first component of an output complex signal; and
- a second summer configured to receive the third and fourth multiplied signals and to output a second component of the output complex signal.

* * * * *

UNITED STATES PATENT AND TRADEMARK OFFICE
CERTIFICATE OF CORRECTION

| | |
|---|---|
| PATENT NO. | : 7,495,484 B1 |
| APPLICATION NO. | : 11/830445 |
| DATED | : February 24, 2009 |
| INVENTOR(S) | : Petrovic |

It is certified that error appears in the above-identified patent and that said Letters Patent is hereby corrected as shown below:

COLUMN 4:
Line 31: Please delete "itself" and insert --itself,--

Signed and Sealed this

Fifteenth Day of September, 2009

David J. Kappos
*Director of the United States Patent and Trademark Office*